(12) United States Patent
Madoglio et al.

(10) Patent No.: US 7,782,104 B2
(45) Date of Patent: Aug. 24, 2010

(54) DELAY ELEMENT ARRAY FOR TIME-TO-DIGITAL CONVERTERS

(75) Inventors: Paolo Madoglio, Milanese (IT); Stefano Pellerano, Beaverton (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/342,443

(22) Filed: Dec. 23, 2008

(65) Prior Publication Data

US 2010/0156485 A1 Jun. 24, 2010

(51) Int. Cl.
*H03L 7/06* (2006.01)
(52) U.S. Cl. ...................................... 327/158; 327/149
(58) Field of Classification Search ....................... None
See application file for complete search history.

(56) References Cited

U.S. PATENT DOCUMENTS

| | | | | |
|---|---|---|---|---|
| 5,614,855 A * | 3/1997 | Lee et al. | .................... | 327/158 |
| 6,100,735 A * | 8/2000 | Lu | .............. | 327/158 |
| 6,492,851 B2 * | 12/2002 | Watarai | ..................... | 327/158 |
| 6,774,694 B1 * | 8/2004 | Stern et al. | ................... | 327/276 |
| 7,154,978 B2 * | 12/2006 | Juan et al. | .................... | 375/376 |
| 7,187,221 B2 * | 3/2007 | Kim et al. | .................... | 327/175 |
| 7,227,809 B2 * | 6/2007 | Kwak | ..................... | 365/189.15 |
| 7,498,890 B2 * | 3/2009 | Wallberg et al. | .............. | 331/17 |
| 7,616,036 B1 * | 11/2009 | Tabatabaei | ................. | 327/158 |
| 7,619,449 B2 * | 11/2009 | Lee | ............................. | 327/141 |

OTHER PUBLICATIONS

J. Christiansen, "An Integrated CMOS 0.15 ns Digital Timing Generator for TDC's and Clock Distribution Systems," in IEEE Transactions on Nuclear Science, vol. 42, Issue 4, Aug. 1995, pp. 753-757.
Antti Mäntyniemi, "An Integrated CMOS High Precision Time-To-Digital Converter Based on Stabilised Three-Stage Delay Line Interpolation," Academic Dissertion to be presented with the assent of the Faculty of Technology, Department of Electrical and Information Engineering and Infotech Oulu, University Oulu, Finland, Oct. 2004.

* cited by examiner

*Primary Examiner*—Cassandra Cox
(74) *Attorney, Agent, or Firm*—Schwabe, Williamson & Wyatt, P.C.

(57) ABSTRACT

Embodiments of the present disclosure provide methods, systems, and apparatuses related to a delay element array for time-to-digital converters. Some embodiments include a voltage controlled oscillator; a time-to-digital converter including a delay element array to output delayed versions of a signal and logic to generate a digital word that represents phase information of the signal based at least in part on the delayed versions; and a phase detector to generate a digital phase error based at least in part on the digital word. Other embodiments may be described and claimed.

10 Claims, 4 Drawing Sheets

DELAY ELEMENT ARRAY FOR TIME-TO-DIGITAL CONVERTERS

FIELD

Embodiments of the present disclosure relate to the field of circuits and, more particularly, to a delay element array for time-to-digital converters.

BACKGROUND

Phase-locked loops (PLLs) are common building blocks in wireless transceivers. They provide a reference signal used to modulate/demodulate data from baseband to radio frequency. In a digital PLL (DPLL), the phase of a voltage-controlled oscillator (VCO) is measured by a time-to-digital converter (TDC) and compared with a high-purity, low-frequency reference inside a phase detector. The phase detector produces a digital word being equal to the error phase, which is digitally filtered and then sent to digital-to-analog converter (DAC) in order to set the control voltage of the VCO. The VCO phase is measured and filtered in the digital domain rather than in analog PLL, thus both an analog-to-digital converter (ADC) and a DAC are used. The TDC acts as an ADC inside the DPLL by measuring the VCO phase and quantizing it to produce a digital word.

Typical implementations of the TDC use a delay line or a delay-locked loop (DLL). A DLL produces an integer number of equally spaced phases by dividing the input signal period into an integer number (equal to the number of delay elements used). The phase of the input signal is measured by sampling each phase of the DLL with a reference clock, with the sampled sequence (zeros and ones) containing the information on the phase to be measured. The resolution (e.g., the least significant bit (LSB)) of the TDC is equal to the delay introduced by each delay element in the DLL. The finite TDC resolution introduces quantization error which, under certain conditions, can be considered as a white noise. The coarser the time resolution, the higher the quantization noise. Since the TDC noise is added in the PLL feedback loop, the noise is low pass filtered by the PLL and it appears as PLL in band noise.

Wireless standards may call for integrated phase noise, e.g., noise inside the transmission channel, as low as −39 decibels relative to a carrier (dBc) for the local oscillator generation. Assuming a loop bandwidth of 1 Megahertz (MHz) and equal contribution to the total phase noise from the VCO and the TDC, the target TDC quantization noise may be −102 dBc/Hz. This target translates into a TDC time resolution, for a 2.7 gigahertz (GHz) carrier, of 10.2 picoseconds (ps). A conventional DLL-based TDC cannot achieve such a resolution since it is limited by the minimum delay of each controllable delay element (at least 20 ps).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Various logic blocks may be introduced and described in terms of an operation provided by the blocks. These logic blocks may include hardware, software, and/or firmware elements in order to provide the described operations. While some of these logic blocks may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
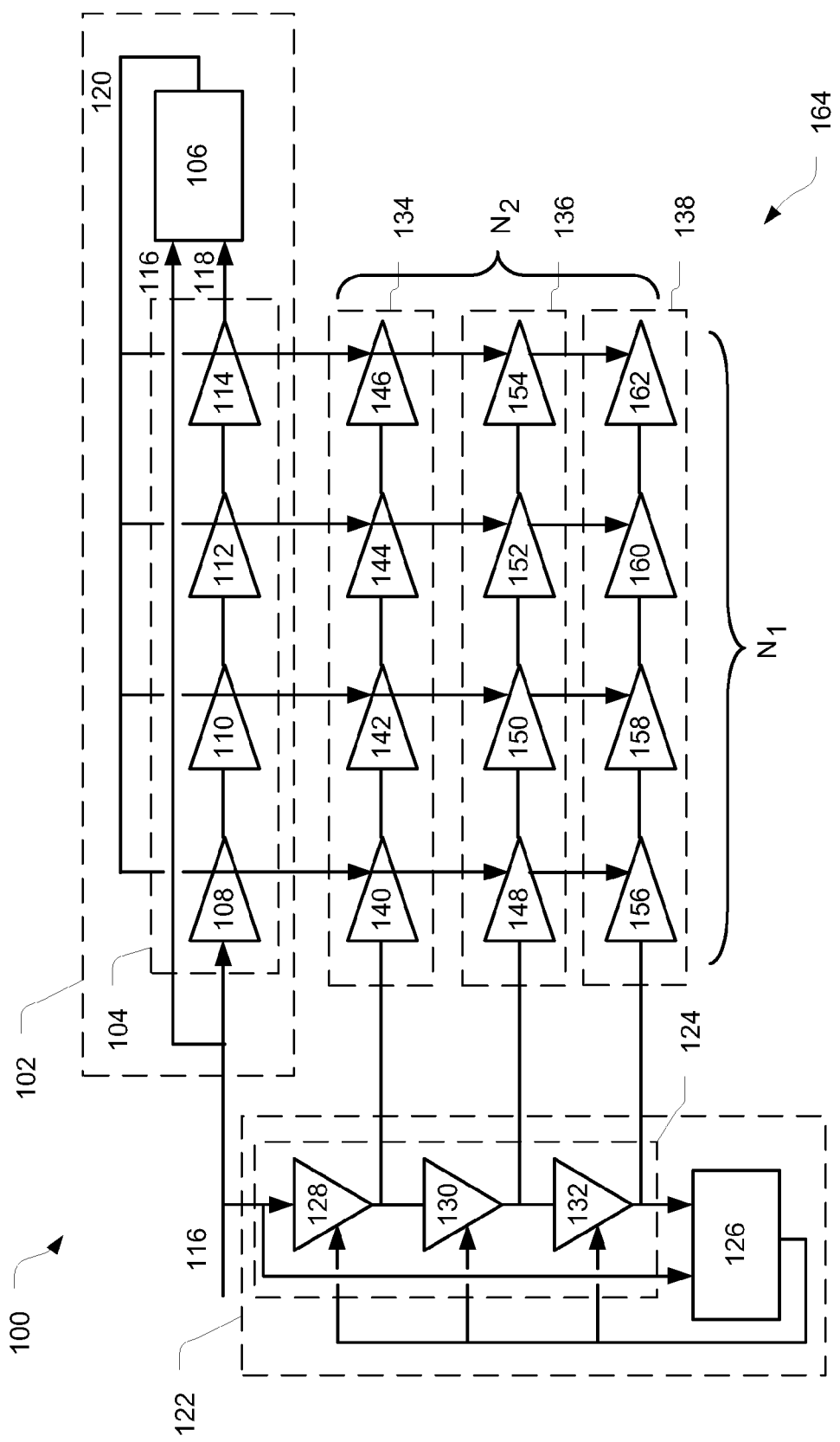
FIG. 1 illustrates a TDC in accordance with some embodiments.

FIG. 1 illustrates a TDC 100 in accordance with some embodiments. The TDC 100 may include a first delay-locked loop 102 that has a delay line 104 coupled to a locking module 106. The delay line 104 may include, e.g., four delay elements, or stages, 108, 110, 112, and 114. The delay line 104 may receive an analog input signal 116 at the input delay element 108. The input delay element 108, and each successive delay element, may add an incremental phase delay, until signal 118, which is a delayed version of signal 116, is output by the output delay element 114.

The locking module 106, which may include a phase-frequency detector (PFD) and a charge pump (CP), may receive the signal 116 and the signal 118 and generate one or more control signals 120. The control signals 120 may control the delay line 104 in a manner such that each of the delay elements 108, 110, 112, and 114 provides an equal phase delay, e.g., of 90 degrees. In general, the phase delay provided by each delay element of a DLL may be determined by dividing the total signal period, e.g., 360 degrees, by the number of delay elements.

The TDC 100 may also include a second DLL 122 that is structurally orthogonal to the first DLL 102. The DLL 122 may include a delay line 124 and a locking module 126. The delay line 124 may include three delay elements 128, 130, and 132. The DLL 122 may operate in a manner similar to DLL 102; however, with a total of three delay elements, the phase delay provided by each delay element may be 120 degrees. Providing the DLL 122 with a number of delay elements that is different from the number of delay elements of DLL 102 may ensure that their phase delays are out-of-phase with respect to one another.

The TDC 100 may also include delay lines 134, 136, and 138. Delay line 134 may include delay elements 140, 142, 144, and 146; delay line 136 may include delay elements 148, 150, 152, and 154; and delay line 138 may include delay elements 156, 158, 160, and 162. The delay lines 134, 136, and 138 may compose an $N_1 \times N_2$ array 164 of delay elements.

Each delay line may be coupled to receive an output from a respective one of the delay elements of the DLL 122. For example, delay line 134 may receive an output of the delay element 128, which is the signal 116 delayed by 120 degrees. The delay line 136 may receive an output from the delay element 130, which is the signal 116 delayed by 240 degrees. The delay line 138 may receive an output from the delay element 132, which is a version of the signal 116 delayed by 360 degrees.

The delay lines may receive the control signals 120 from the DLL 102 that locks the delay elements and ensures that they each add an equal phase delay, e.g., 90 degrees in this embodiment. Provided that $N_1$ is prime with respect to $N_2$, i.e., they do not share a common integer divider, the array 164 will produce 12, i.e., $N_1*N_2$, equally spaced phases. Specifically, delay element 140 will output a version of the signal 116 delayed 210 degrees from signal 116, which may be referred to as a 210 degree signal; delay element 142 will output a 300 degree signal; delay element 144 will output a 30 degree signal; delay element 146 will output a 120 degree signal; delay element 148 will output a 330 degree signal; delay element 150 will output a 60 degree signal; delay element 152 will output a 150 degree signal; delay element 154 will output a 240 degree signal; delay element 156 will output a 90 degree signal; delay element 158 will output a 180 degree signal; delay element 160 will output a 270 degree signal; and delay element 162 will output a 0 degree signal.

The DLL 122 providing the out-of-phase inputs to the delay lines 134, 136, and 138 allows the time resolution of the TDC 100 to have a low-end granularity that is not limited by the phase delay of a single delay element. If $\Delta t$ is the phase delay of a single delay element and $T_{in}$ is a signal period of the signal 116, the number of delay elements for a particular delay line may be provided by $k=T_{in}/\Delta t$. Thus, $N_1$ may be set to k and $N_2$ may be set to (k−1), since two consecutive numbers are always prime relative to one another. The total number of phases in which the signal period $T_{in}$ is divided may be k*(k−1), so the time resolution of the TDC 100 may be equal to $T_{in}/(k*(k-1))=\Delta t/(k-1)$.

Providing the control signals 120 from the DLL 102 to the delay lines 134, 136, and 138 effectively closes a feedback loop for each of the delay lines of the array 164 by setting the proper control voltage for each delay element of the array 164. This is accomplished without repeating the locking circuitry for each of the delay lines, which may reduce the area of silicon desired to implement the TDC 100 as well as reduce the overall power consumption. Moreover, since the control signals 120 are shared by the DLL 102 and all of the delay lines of the array 164, this embodiment is less sensitive to PFD/CP mismatch.

Device mismatch effects may compromise the performance of prior art delay lines such as a Vernier TDC. Assuming that a Vernier TDC had the same time resolution as the TDC 100, the number of delay elements in the Vernier TDC would be k*(k−1), while the array 164 is k by (k−1). The number of cascaded delay elements may be k*(k−1) for the Vernier TDC and only k+(k−1)=2k−1 for the TDC 100. Since the mismatch of each delay element may be accumulated along the delay line, the TDC 100 may accumulate less mismatch.

If the delay element for each TDC topology is sized such that the maximum accumulated mismatch variance is equal in both cases, the variance of the single delay element in the Vernier TDC will be k*(k−1)/(2k−1)~k/2, if (k>>1), smaller than that of the TDC 100. Finally, since the variance of the delay element scales linearly with the size and, thus, power consumption, the Vernier TDC will consume k/2 the power of the TDC 100 and occupy k/2 the silicon to achieve the same matching.

As an example, to achieve a phase noise of at least −102 dBc/Hz for a 2.7 GHz carrier, a TDC embodiment of the present disclosure may have an array with 6×7 delay elements to provide an 8.8 ps resolution, or a Vernier TDC may have 37 elements to provide a 10 ps resolution. To achieve the same matching, the Vernier TDC size and power consumption will be 37/(6+7)=2.84 times higher than that of the TDC embodiment.

It may be understood that for each of the delay lines to receive an output from a respective one of the delay elements of the DLL 122, $N_2$ may be set equal to the number of delay elements of DLL 122. Furthermore, for the delay elements of the array 164 to be properly controlled by the control signals 120, $N_1$ may be set equal to the number of delay elements of DLL 102.

While FIG. 1 illustrates a simplified embodiment in which $N_1$ is 4 and $N_2$ is 3, other embodiments may include any other numbers.

Figure 2:
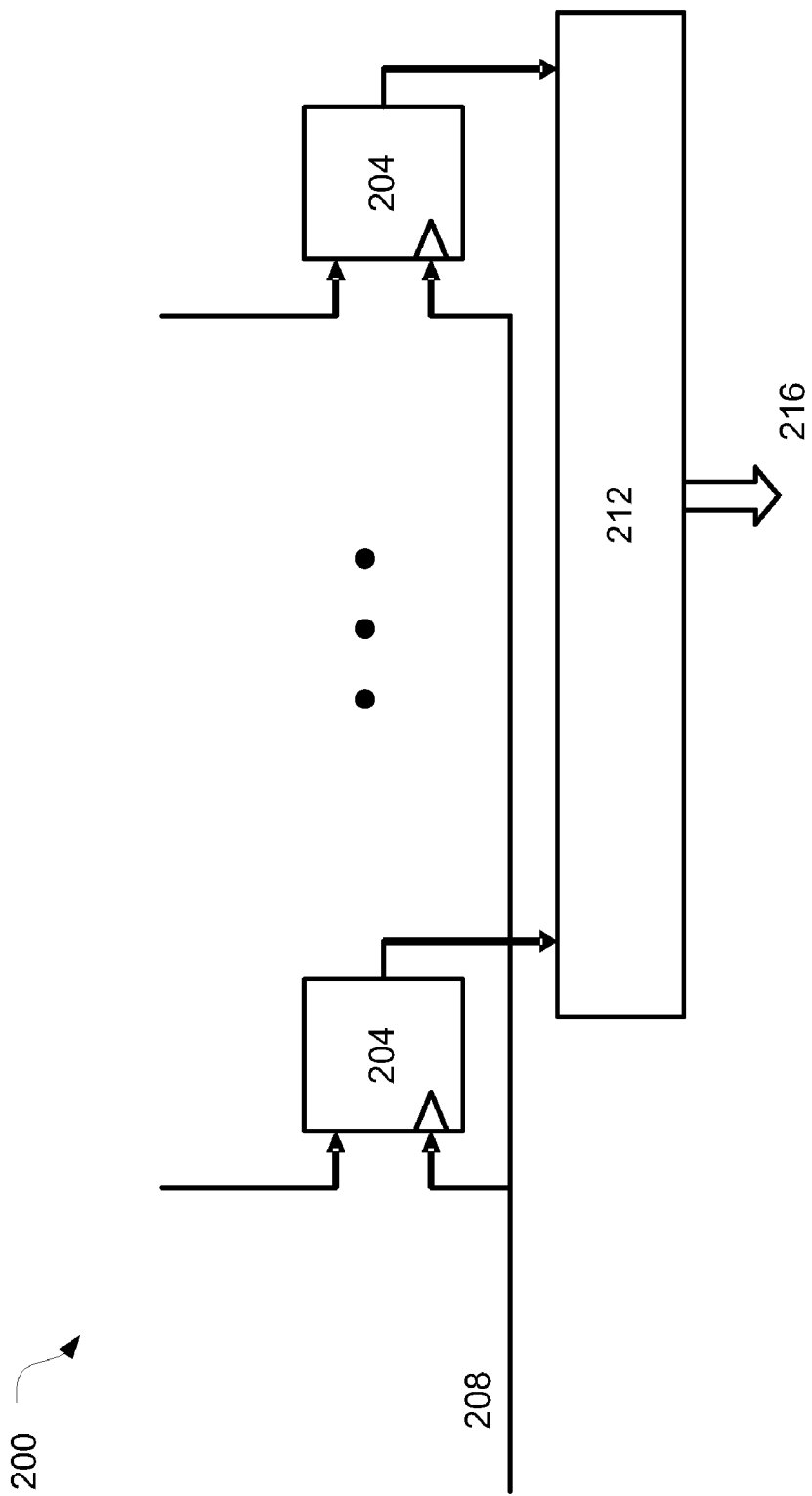
FIG. 2 illustrates sampling circuitry of a TDC in accordance with some embodiments.

FIG. 2 illustrates sampling circuitry 200 in accordance with some embodiments. The sampling circuitry 200 may be part of the TDC 100 shown in FIG. 1. Specifically, the sampling circuitry 200 may be coupled to the array 164 in order to digitize the signals output from the delay elements.

The sampling circuitry 200 may include a flip flop (FF) 204 for each of the delay elements of the array 164. The FFs 204 may be coupled with a reference clock signal 208 and may provide the values of the respective delay elements to logic 212 at a set time, e.g., a rising edge of the reference clock signal. A high value may be recorded as a logical 1, while a low value may be recorded as a logical 0, or vice versa. The logic 212 may then output a digital word 216 that represents phase information of the signal 116.

Figure 3:
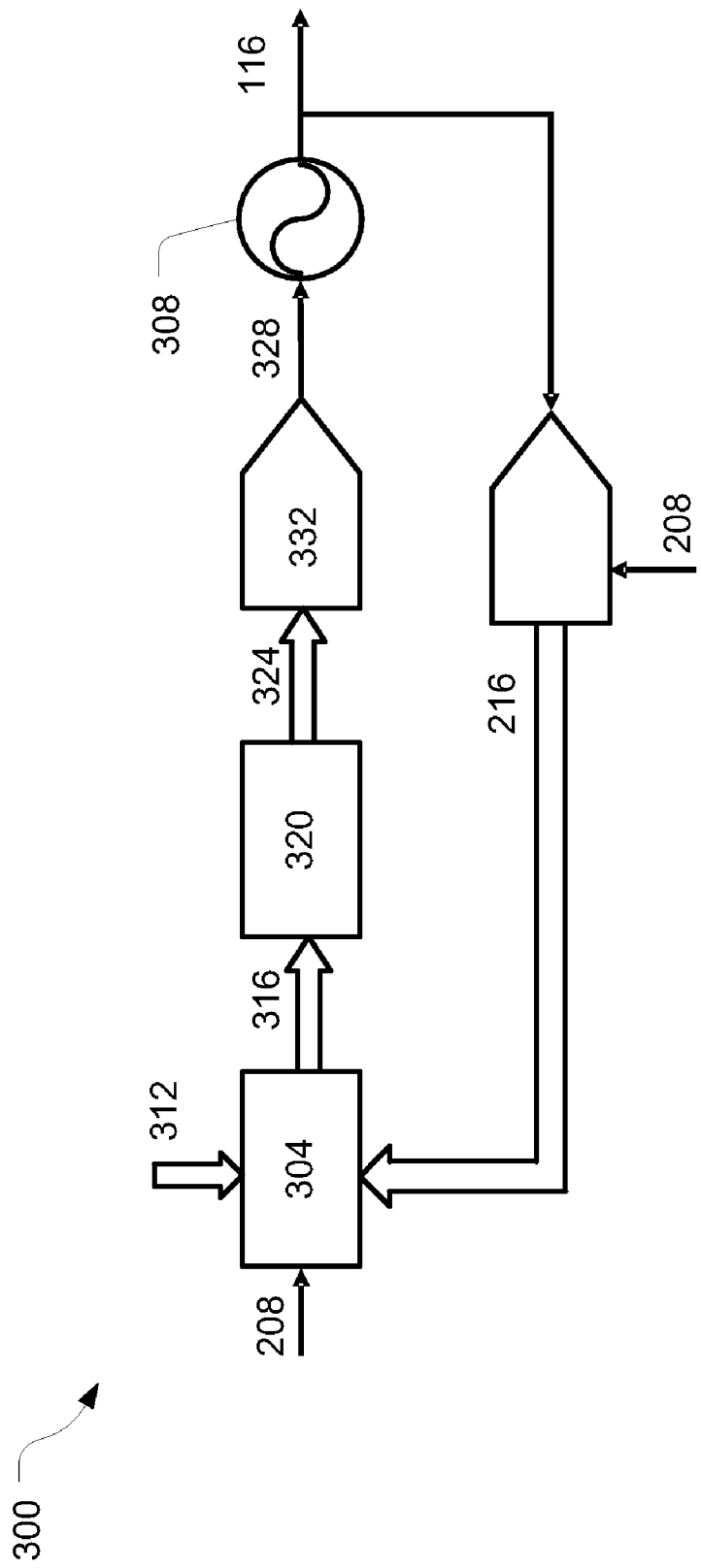
FIG. 3 illustrates a DPLL utilizing a TDC in accordance with some embodiments.

FIG. 3 illustrates a DPLL 300 utilizing the TDC 100 in accordance with some embodiments. The DPLL 300 may include a phase detector 304 that is coupled to the TDC 100 to receive the digital word 216 that represents the phase information of the signal 116. The signal 116 may be output by a VCO 308 in this embodiment. The phase detector 304 may also receive the clock reference signal 208 and a reference digital word 312. The phase detector 304 may generate and output a digital phase error based on the differences between the digital word 216 and the reference digital word 312.

The digital phase error 316 may be filtered at filter 320 to generate a digital control signal 324. The digital control signal 324 may be converted to an analog control signal 328 by an ADC 332. The analog control signal 328 may be provided to the VCO 308 to adjust the phase of the signal 116.

Using the TDC 100 enables the DPLL 300 to be used in high-spectral purity applications, e.g., new generation wireless radios, with stringent phase noise specifications. The TDC 100 may provide a higher resolution, resulting in lower in-band phase noise, and lower power/space as compared to existing DPLLs. This allows a designer to enlarge the bandwidth of a DPLL without compromising the overall phase noise performance.

Providing the DPLL 300 with a wide bandwidth may also be beneficial in filtering the noise of the VCO 308. As technology scales together with power supply, VCO phase noise generated by device flicker noise and power supply disturbances (an issue especially with high level of integration) may limit the noise performance of conventional bandwidth (e.g., 50-200 kilohertz (kHz)) PLLs. A TDC having a resolution of less than 10 ps, as may be provided with TDC 100, may widen the bandwidth of the DPLL 300 up to, e.g., 1 megahertz (MHz). The DPLL 300, having such a bandwidth, may be able to tolerate more noise from the VCO 308 while still meeting the phase noise objectives of wireless communication standards. This may also relax the power/noise/tuning range trade-off in design of the VCO 308.

Figure 4:
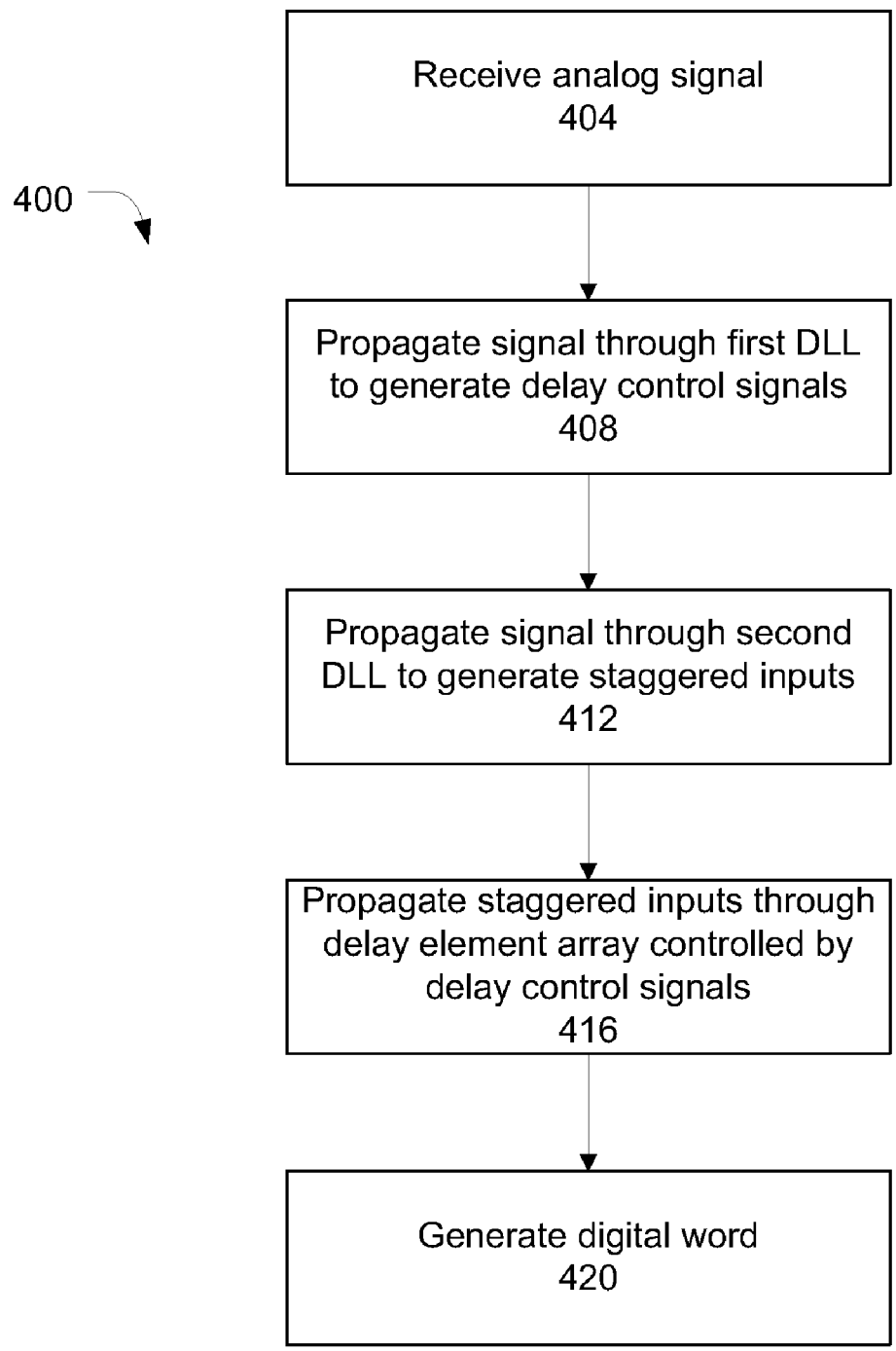
FIG. 4 illustrates operation of a TDC in accordance with some embodiments.

FIG. 4 illustrates a flowchart 400 describing operation of the TDC 100 in accordance with some embodiments. The TDC 100 may receive an analog signal, e.g., signal 116, at block 404. When operating in a DPLL, the received analog signal may be a VCO output that is fed back to the TDC 100.

At block 408, the TDC 100 may propagate the signal 116 through the delay elements of the DLL 102 to generate delay control signals 120. As described above, the delay control signals 120 may control the delay elements of the DLL 102 in a manner so that they provide equal phase delays and, therefore, provide equal phase spacing between successive delay elements.

At block 412, the TDC 100 may propagate the signal 116 through the delay elements of the DLL 122 to generate out-of-phase inputs for the array 164. As the DLL 122 is also locked, the out-of-phase inputs will also have equal phase spacing relative to one another.

At block 416, the TDC 100 may propagate the out-of-phase inputs from the DLL 122 through the delay elements of the array 164 that are controlled by the control signals 120.

At block 420, the sampling circuitry 200 may generate the digital word 216 based on the outputs of the delay elements of the array 164. When the TDC 100 is used in a DPLL, this digital word 216 may be used as the feedback provided to the phase detector, e.g., phase detector 304.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A system comprising:
a voltage controlled oscillator (VCO) to output a signal;
a time-to-digital converter (TDC) having a first delay-locked loop (DLL) to receive the signal and to generate one or more control signals; a second DLL to receive the signal and to generate one or more delayed versions of the signal; and an array of a plurality of delay elements configured to output a corresponding plurality of delayed versions of the signal based at least in part on the one or more control signals and the one or more delayed versions of the signal; and logic coupled to the array of the plurality of delay elements and configured to generate a digital word that represents phase information of the signal based at least in part on the plurality of delayed versions; and
a phase detector coupled to the TDC and configured to generate a digital phase error based at least in part on the digital word and a reference digital word.

2. The system of claim 1, wherein the first and second DLLs are structurally orthogonal to each other.

3. The system of claim 1, wherein the array of the plurality of delay elements includes one or more delay lines with each of the one or more delay lines configured to receive a respective one of the one or more delayed versions from the second DLL.

4. The system of claim 1, wherein the system comprises a digital phase-locked loop.

5. The system of claim 1, wherein the array of the plurality of delay elements includes one or more delay lines configured to receive the one or more control signals from the first DLL.

6. The system of claim 1, wherein the first DLL includes $N_1$ delay elements, the second DLL includes $N_2$ delay elements, and the plurality of delay elements of the array are arranged as $N_2$ delay lines with each of the $N_2$ delay lines having $N_1$ delay elements.

7. The system of claim 6, wherein $N_1$ is prime with respect to $N_2$.

8. A method comprising:
propagating a first signal through a delay element of a first delay-locked loop (DLL);
generating, by the first DLL, a control signal to control a delay provided by the delay element of the first DLL;
propagating the first signal through a delay element of a second DLL;
propagating an output of the delay element of the second DLL through a delay element of a delay line;
controlling a delay provided by the delay element of the delay line with the control signal; and
generating a digital word based at least in part on an output from the delay element of the delay line.

9. The method of claim 8, wherein the second DLL includes a plurality of delay elements to output a corresponding plurality of delayed versions of the signal, and the method further comprises:
propagating an output from each of the plurality of delay elements through a respective delay line.

10. The method of claim 8, further comprising:
controlling a voltage-controlled oscillator based at least in part on the digital word.

* * * * *